(12) United States Patent
Kim (10) Patent No.: US 9,007,852 B2
(45) Date of Patent: Apr. 14, 2015

(54) SEMICONDUCTOR INTEGRATED CIRCUIT (71) Applicant: SK Hynix Inc., Icheon-si, Gyeonggi-do (KR)

(72) Inventor: Jae Il Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/018,904

(22) Filed: Sep. 5, 2013

(65) Prior Publication Data

US 2014/0340968 A1    Nov. 20, 2014

(30) Foreign Application Priority Data

May 20, 2013   (KR) .................. 10-2013-0056426

(51) Int. Cl.
*G11C 7/10* (2006.01)
*G11C 7/22* (2006.01)

(52) U.S. Cl.
CPC ............. *G11C 7/1078* (2013.01); *G11C 7/1066* (2013.01); *G11C 7/106* (2013.01); *G11C 7/22* (2013.01); *G11C 7/1051* (2013.01); *G11C 7/1087* (2013.01); *G11C 7/1039* (2013.01); *G11C 7/222* (2013.01)

(58) Field of Classification Search
CPC ...... G11C 7/22; G11C 7/1051; G11C 7/1066; G11C 8/06; G11C 7/1087; G11C 7/1072; G11C 11/4076; G11C 7/1006; G11C 7/1078
USPC .................. 365/189.05, 230.08, 194, 189.02
See application file for complete search history.

(56) References Cited

U.S. PATENT DOCUMENTS 8,027,203 B2 *  9/2011 Shin .................. 365/189.05
8,050,374 B2 * 11/2011 Kim et al. ............... 375/372

FOREIGN PATENT DOCUMENTS

KR   100560947 B1   3/2006
KR   100906644 B1   7/2009

* cited by examiner

*Primary Examiner* — David Lam
(74) *Attorney, Agent, or Firm* — William Park & Associates Patent Ltd.

(57) ABSTRACT

A semiconductor integrated circuit includes: a latch unit configured to latch data in response to an input control signal; and a latch control unit configured to determine whether or not any one of first and second memory areas is successively accessed, and adjust timing of the input control signal.

26 Claims, 7 Drawing Sheets

SEMICONDUCTOR INTEGRATED CIRCUIT

CROSS-REFERENCES TO RELATED APPLICATION

The present application claims priority under 35 U.S.C. §119(a) to Korean application number 10-2013-0056426, filed on May 20, 2013, in the Korean Intellectual Property Office, which is incorporated herein by reference in its entirety.

BACKGROUND

1. Technical Field

Various embodiments generally relate to a semiconductor circuit, and more particularly, to a semiconductor integrated circuit.

2. Related Art

A semiconductor integrated circuit may include a plurality of unit memory areas, for example, a plurality of memory banks.

The semiconductor integrated circuit may divide and control the plurality of memory banks. For example, the semiconductor integrated circuit may divide eight memory banks into memory banks <0:3> (hereafter, up bank) and memory banks <4:7> (hereafter, down bank) so as to control the memory banks.

As a read command for accessing any one of the up bank and the down bank, for example, the up bank is applied, data is outputted from the up bank.

At this time, when successive read commands for successively accessing the up bank are applied, a power supply voltage supplied to the up bank may drop.

The semiconductor integrated circuit may include a pipe latch circuit (hereafter, referred to as a pipe latch) as an essential component to provide a pre-fetch function for high-speed operation.

The pipe latch receives data outputted from a memory bank according to an input control signal for controlling an input of the pipe latch.

At this time, the power supply voltage may drop according to successive read commands for the up bank. Thus, the timing of the input control signal related to the up bank is moved back from a target value.

Therefore, when a read command for the down bank is applied after the successive read commands for the up bank, the timing of the input control signal generated in connection with the up bank and the timing of the input control signal generated in connection with the down bank may overlap each other to cause a read operation error.

SUMMARY

Various embodiments are directed to a semiconductor integrated circuit capable of stably performing a data latch operation.

In an embodiment of the present invention, a semiconductor integrated circuit includes: a latch unit configured to latch data in response to an input control signal; and a latch control unit configured to determine whether or not any one of first and second memory areas is successively accessed, and adjust timing of the input control signal.

The latch unit may include a pipe latch.

The latch control unit may be configured to increase a delay time of a source signal corresponding to the other memory area when the other memory area is accessed in a state where the number of successive accesses to the one memory area is equal to or more than a preset number.

In an embodiment of the present invention, a semiconductor integrated circuit includes: a memory block configured to output data in response to an access and generate a timing signal in response to a source signal; a latch unit configured to latch the data in response to an input control signal; a delay control signal generation unit configured to determine whether the number of successive accesses to any one of first and second memory areas of the memory block is equal to or more than a preset number according to an address signal and an access flag signal based on an even clock signal and an odd clock signal, respectively, and generate a delay control signal; a source signal generation unit configured to generate the source signal by adjusting timing of the access flag signal in response to the delay control signal; and an input control signal generation unit configured to generate the input control signal in response to the timing signal.

BRIEF DESCRIPTION OF THE DRAWINGS

Features, aspects, and embodiments are described in conjunction with the attached drawings, in which.

DETAILED DESCRIPTION

Hereinafter, a semiconductor integrated circuit according to the present invention will be described below with reference to the accompanying drawings through various embodiments.

Figure 1:
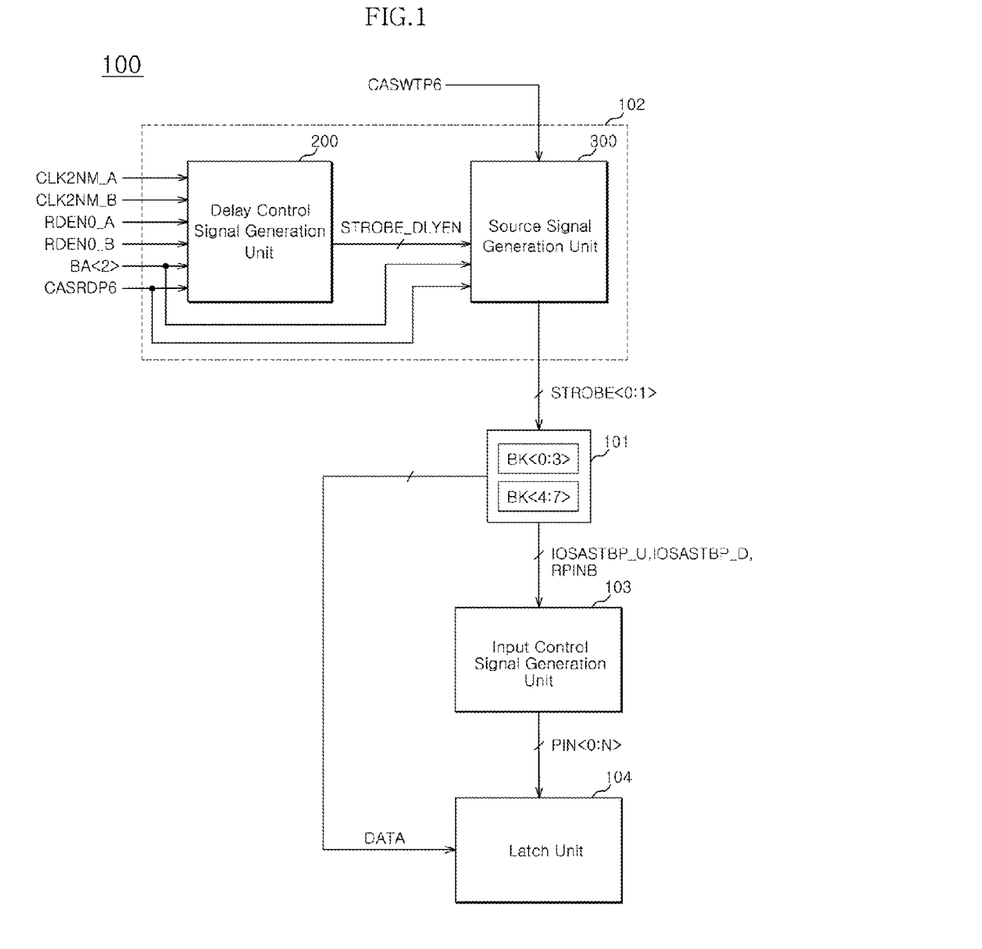
FIG. 1 is a block diagram of a semiconductor integrated circuit 100 according to an embodiment of the present invention.

FIG. 1 is a block diagram of a semiconductor integrated circuit 100 according to an embodiment of the present invention.

Referring to FIG. 1, a semiconductor integrated circuit 100 according to an embodiment of the present invention may include a memory block 101, a latch control unit 102, an input control signal generation unit 103, and a latch unit 104.

The memory block 101 may include a plurality of unit memory blocks, for example, a plurality of memory banks BK<0:7> and a signal processing block (not illustrated).

The semiconductor integrated circuit 100 may divide the plurality of memory banks BK<0:7> into first memory areas BK<0:3> (hereafter, referred to as an up bank) and second memory areas BK<4:7> (hereafter, referred to as a down bank), for example, so as to control the plurality of memory banks BK<0:7>.

As a read command for accessing any one of the up bank and the down bank, for example, the up bank is applied, data is outputted from the up bank.

The memory block 101 may be configured to generate a plurality of input timing signals IOSASTBP_U, IOSASTBP_D, and RPINB in response to source signals STROBE<0:1>.

The input control signal generation unit 103 may be configured to generate an input control signal PIN<0:N> in response to the plurality of input timing signals IOSASTBP_U, IOSASTBP_D, and RPINB.

The latch unit 104 may be configured to receive data DATA outputted from the up bank or down bank in response to the input control signal PIN<0:N>.

The latch unit 104 may include a pipe latch.

The latch control unit 102 may be configured to generate the source signals STROBE<0:1> in response to clock signals CLK2NM_A and CLK2NM_B, access period signals RDENO_A and RDENO_B, an address signal BA<2>, and an access flag signal CASRDP6.

Additionally, the clock signal CLK2NM_A and the clock signal CLK2NM_B are synchronized with an even clock pulse and an odd clock pulse of an external clock signal CLK, respectively, and may be referred to as an even clock signal and an odd clock signal.

The access flag signal CASRDP6 may be generated according to a read command.

The latch control unit 102 may be configured to determine whether or not any one of the up bank and the down bank is successively accessed, that is, whether or not successive read commands are inputted and adjust the timing of the source signals STROBE<0:1>.

The latch control unit 102 may be configured to adjust the timing of the source signals STROBE<0:1> when a read command for the other bank is inputted in a state where the number of successive read commands for the one of the up bank and the down bank is equal or more than a preset number.

The latch control unit 102 may be configured to increase a delay time of a signal corresponding to the address signal BA<2> in the source signals STROBE<0:1> when a read command for the other bank is inputted in a state where the number of successive read commands for the one of the up bank and the down bank is equal to or more than the preset number.

The latch control unit 102 may include a delay control signal generation unit 200 and a source signal generation unit 300.

The delay control signal generation unit 200 may be configured to determine whether the number of accesses is equal to or more than a preset number in response to the clock signals CLK2NM_A and CLK2NM_B, the access period signals RDENO_A and RDENO_B, the address signal BA<2>, and the access flag signal CASRDP6, and generate a delay control signal STROBE_DLYEN according to the determination result.

The source signal generation unit 300 may be configured to generate the source signals STROBE<0:1> in response to the delay control signal STROBE_DLYEN, the address signal BA<2>, and the access flag signal CASRDP6.

Figure 2:
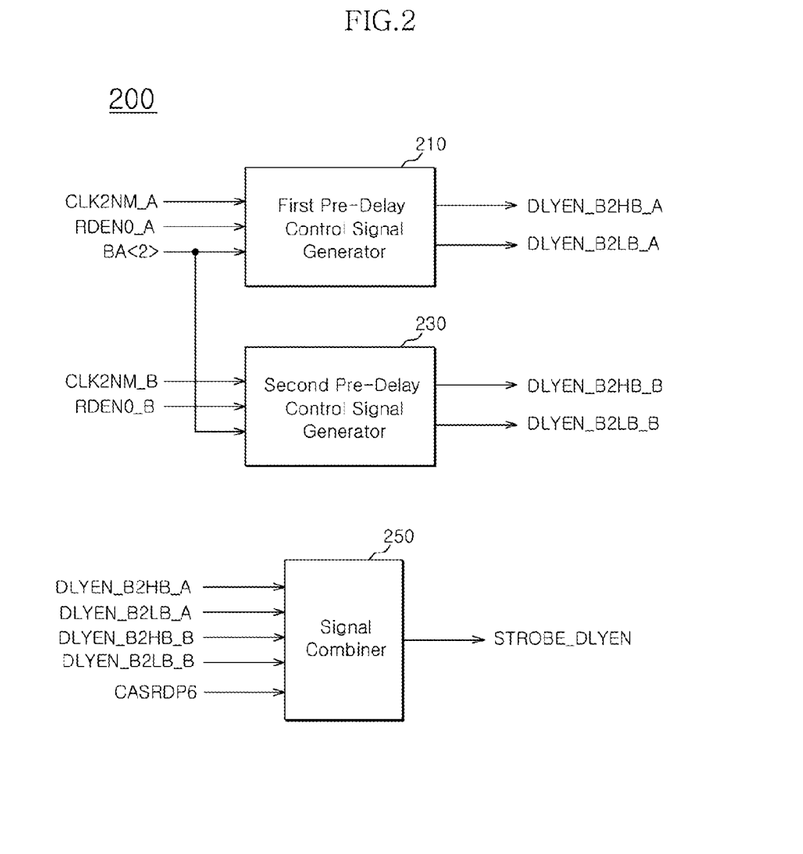
FIG. 2 is a circuit diagram illustrating the internal configuration of a delay control signal generation unit 200 of FIG. 1.

FIG. 2 is a circuit diagram illustrating the internal configuration of the delay control signal generation unit 200 of FIG. 1.

Referring to FIG. 2, the delay control signal generation unit 200 may include a first pre-delay control signal generator 210, a second pre-delay control signal generator 220, and a signal combiner 250.

The first pre-delay control signal generator 210 may be configured to generate a first pre-delay control signal pair DLYEN_B2HB_A and DLYEN_B2LB_A in response to the clock signal CLK2NM_A, the access period signal RDENO_A, and the address signal BA<2>.

The second pre-delay control signal generator 230 may be configured to generate a second pre-delay control signal pair DLYEN_B2HB_B and DLYEN_B2LB_B in response to the clock signal CLK2NM_B, the access period signal RDENO_B, and the address signal BA<2>.

The signal combiner 250 may be configured to generate the delay control signal STROBE_DLYEN in response to the first pre-delay control signal pair DLYEN_B2HB_A and DLYEN_B2LB_A, the second pre-delay control signal pair DLYEN_B2HB_B and DLYEN_B2LB_B, and the access flag signal CASRDP6.

Figure 3:
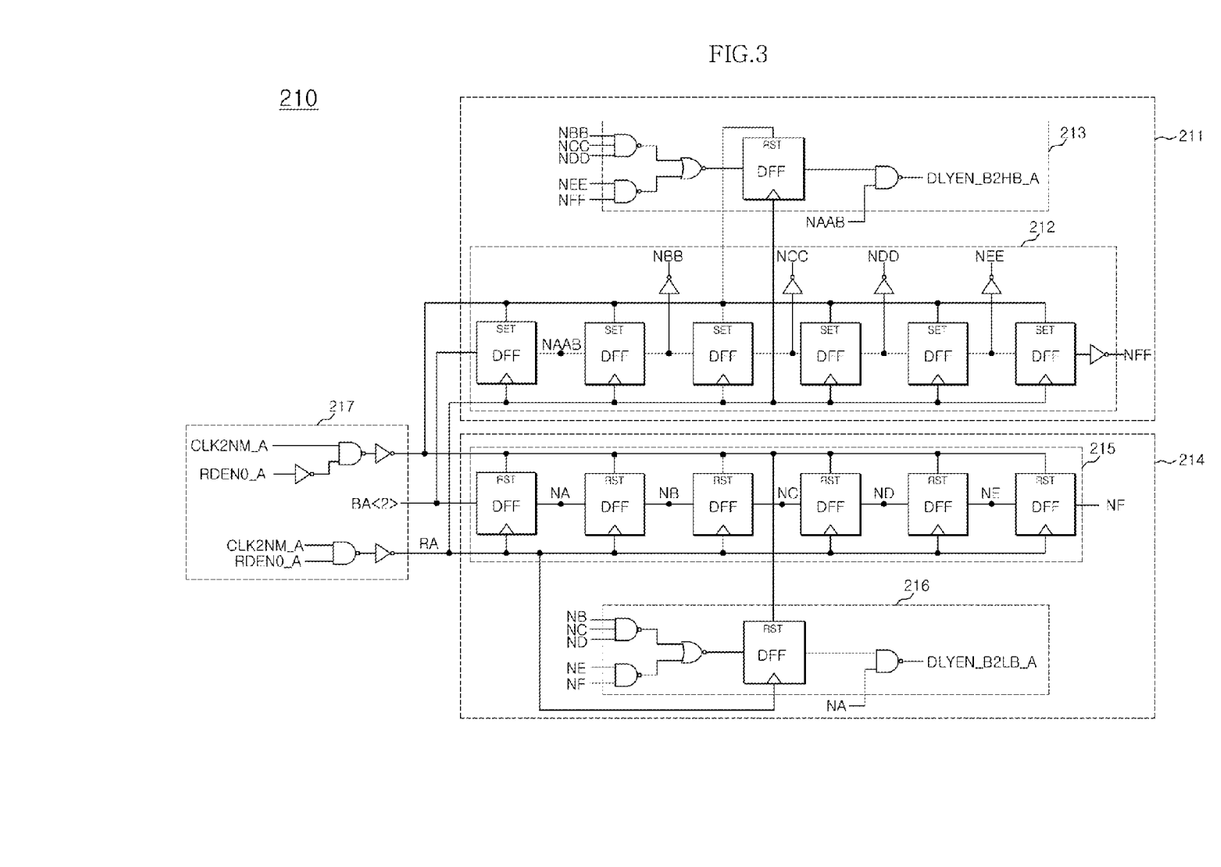
FIG. 3 is a circuit diagram illustrating the internal configuration of a first pre-delay control signal generator 210 of FIG. 2.

FIG. 3 is a circuit diagram illustrating the internal configuration of the first pre-delay control signal generator 210 of FIG. 2.

Referring to FIG. 3, the first pre-delay control signal generator 210 may include a first determination section 211, a second determination section 214, and a shift control section 217.

The first determination section 211 may be configured to determine whether or not a read command for the other bank (for example, a down bank) is inputted in a state where successive read commands for any one of the up bank and the down bank (for example, the up bank) are inputted a predetermined number of times (for example, five) or more, in response to the address signal BA<2>, and activate the first pre-delay control signal DLYEN_B2HB_A.

The first determination section 211 may include a shifter 212 and a successive access determination logic 213.

The shifter 212 may include a plurality of flip-flops (i.e., DFF) and a plurality of inverters.

The shifter 212 may be configured to sequentially shift the address signal BA<2> according to a shift clock signal RA and generate a plurality of shifted signal NAAB, NBB, NCC, NDD, NEE, and NFF, after reset.

At this time, among the plurality of shifted signals NAAB, NBB, NCC, NDD, NEE, and NFF, the signals excluding the shifted signal NAAB may be obtained by inverting output signals of the plurality of flip-flops.

The successive access determination logic 213 may include a plurality of logic gates and a flip-flop.

The successive access determination logic 213 may be configured to combine the plurality of shifted signals NAAB, NBB, NCC, NDD, NEE, and NFF and generate the first pre-delay control signal DLYEN_B2HB_A.

The second determination section 214 may be configured to determine whether a read command for the other bank (for example, the up bank) is inputted in a state where successive read commands for any one of the up bank and the down bank (for example, the down bank) are inputted a predetermined number of times (for example, five) or more, in response to the address signal BA<2>, and activate the first pre-delay control signal DLYEN_B2LB_A.

The second determination section 214 may include a shifter 215 and a successive access determination logic 216.

The shifter 215 may include a plurality of flip-flops (i.e., DFF).

The shifter 215 may be configured to sequentially shift the address signal BA<2> according to the shift clock signal RA and generate a plurality of shifted signals NA, NB, NC, ND, NE, and NF, after reset.

The successive access determination logic 216 may include a plurality of logic gates and a flip-flop.

The successive access determination logic 216 may be configured to combine the plurality of shifted signals NA, NB, NC, ND, NE, and NF and generate the first-pre delay control signal DLYEN_B2LB_A.

The shift control section 217 may be configured to control the first determination section 211 and the second determination section 214 in response to the clock signal CLK2NM_A and the access period signal RDENO_A.

The shift control section 217 may be configured to reset the first and second determination sections 211 and 214 according to a result obtained by performing an AND operation on the clock signal CLK2NM_A and the inverted access period signal RDENO_A.

The shift control section 217 may be configured to output a result obtained by performing an AND operation on the clock signal CLK2NM_A and the access period signal RDENO_A as the shift clock signal RA.

Figure 4:
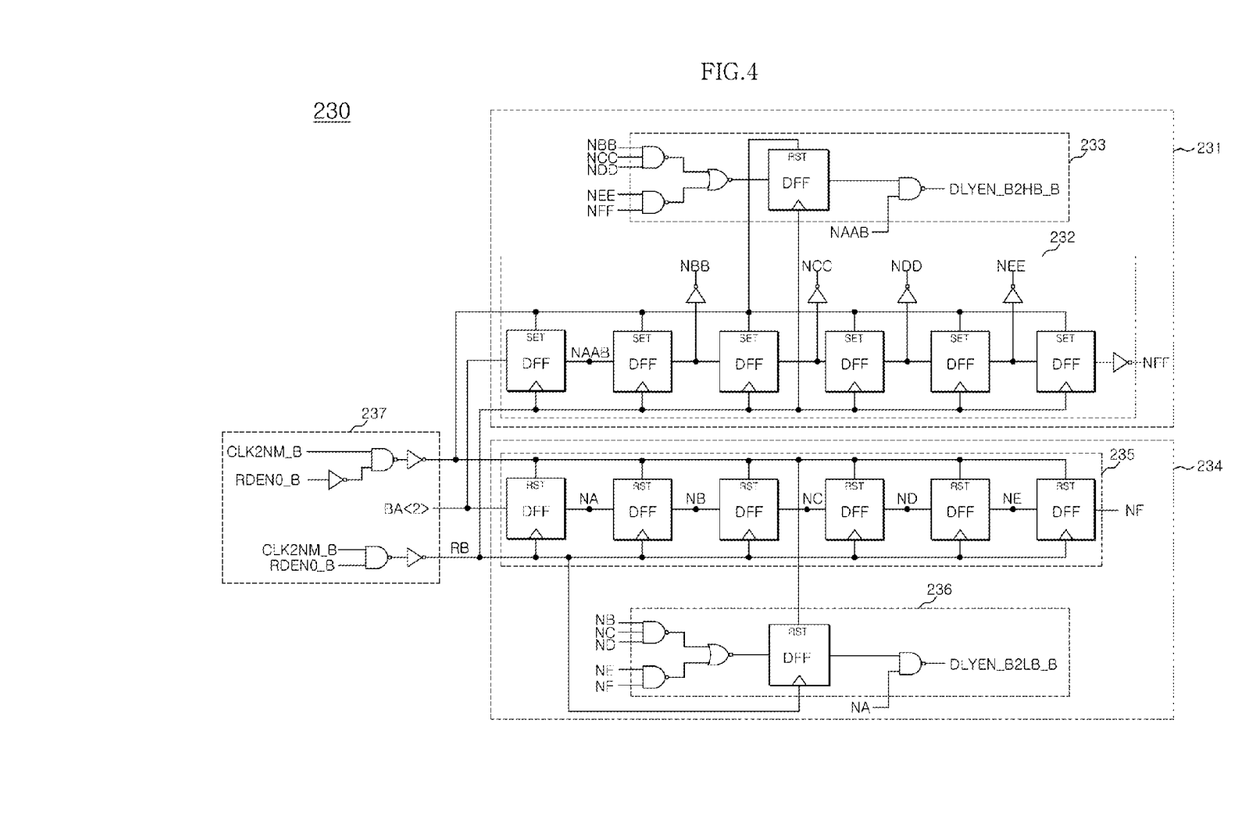
FIG. 4 is a circuit diagram illustrating the internal configuration of a second pre-delay control signal generator 230 of FIG. 2.

FIG. 4 is a circuit diagram illustrating the internal configuration of the second pre-delay control signal generator 230 of FIG. 2.

Referring to FIG. 4, the second pre-delay control signal generator 230 may include a first determination section 231, a second determination section 234, and a shift control section 237.

The first determination section 231 may be configured to determine whether or not a read command for the other bank (for example, the down bank) is inputted in a state where successive read commands for any one of the up bank and the down bank (for example, the up bank) are inputted a predetermined number of times (for example, five) or more, in response to address signal BA<2>, and activate the second pre-delay control signal DLYEN_B2HB_B.

The first determination section 231 may include a shifter 232 and a successive access determination logic 233.

The shifter 232 may include a plurality of flip-flops (i.e., DFF) and a plurality of inverters.

The shifter 232 may be configured to sequentially shift the address signal BA<2> according to a shift clock signal RB and generate a plurality of shifted signals NAAB, NBB, NCC, NDD, NEE, and NFF, after reset.

Additionally, among the plurality of shifted signals NAAB, NBB, NCC, NDD, NEE, and NFF, the signals excluding the shifted signal NAAB may be obtained by inverting output signals of the plurality of flip-flops.

The successive access determination logic 233 may include a plurality of logic gates and a flip-flop.

The successive access determination logic 233 may be configured to combine the plurality of shifted signals NAAB, NBB, NCC, NDD, NEE, and NFF and generate the second pre-delay control signal DLYEN_B2HB_B.

The second determination section 234 may be configured to determine whether or not a read command for the other bank (for example, the up bank) is inputted in a state where successive read commands for any one of the up bank and the down bank (for example, the down bank) are inputted a predetermined number of times (for example, five) or more, in response to address signal BA<2>, and activate the second pre-delay control signal DLYEN_B2LB_B.

The second determination section 234 may include a shifter 235 and a successive access determination logic 236.

The shifter 235 may include a plurality of flip-flops.

The shifter 235 may be configured to sequentially shift the address signal BA<2> according to the shift clock signal RB and generate a plurality of shifted signals NA, NB, NC, ND, NE, and NF, after reset.

The successive access determination logic 236 may include a plurality of logic gates and a flip-flop.

The successive access determination logic 236 may be configured to combine the plurality of shifted signals NA, NB, NC, ND, NE, and NF and generate the second pre-delay control signal DLYEN_B2LB_B.

The shift control section 237 may be configured to control the first determination section 231 and the second determination section 234 in response to the clock signal CLK2NM_B and the access period signal RDENO_B.

The shift control section 237 may be configured to reset the first and second determination sections 231 and 234 according to a result obtained by performing an AND operation on the clock signal CLK2NM_B and the inverted access period signal RDENO_B.

The shift control section 237 may be configured to output a result obtained by performing an AND operation on the clock signal CLK2NM_B and the access period signal RDENO_B as the shift clock signal RB.

Figure 5:
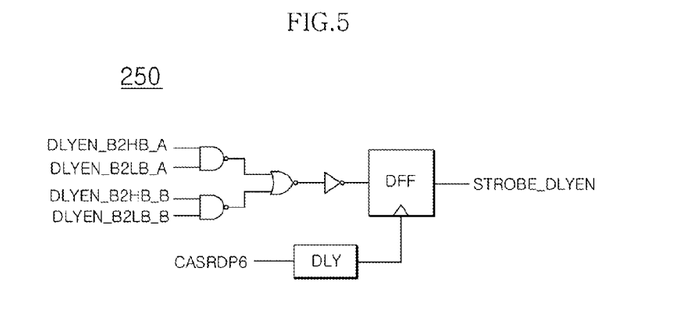
FIG. 5 is a circuit diagram illustrating the internal configuration of a signal combiner 250 of FIG. 2.

FIG. 5 is a circuit diagram illustrating the internal configuration of the signal combiner 250 of FIG. 2.

Referring to FIG. 5, the signal combiner 250 may include a plurality of logic gates, a delay (i.e., DLY), and a flip-flop (i.e., DFF).

The signal combiner 250 may be configured to perform an OR operation on a result obtained by performing a NAND operation on the first pre-delay control signal pair DLYEN_B2HB_A and DLYEN_B2LB_A and a result obtained by performing a NAND operation on the second pre-delay control signal pair DLYEN_B2HB_B and DLYEN_B2LB_B, latch the OR operation result according to the access flag signal CASRDP6, and output the latched signal as the delay control signal STROBE_DLYEN.

Figure 6:
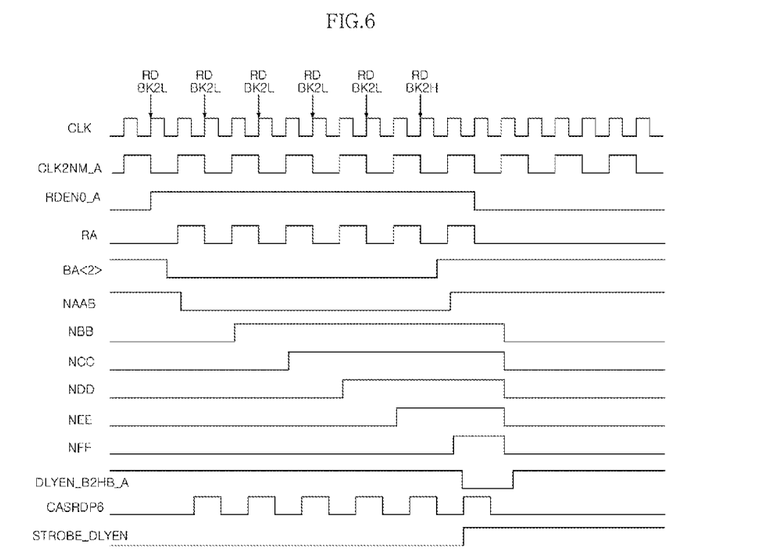
FIG. 6 is an operation timing diagram of a delay control signal generation unit 200 of FIG. 1

FIG. 6 is an operation timing diagram of the delay control signal generation unit 200 of FIG. 1.

Referring to FIGS. 2 to 6, the operation of the delay control signal generation unit 200 will be described as follows.

The semiconductor integrated circuit 100 may use divided clock signals, that is, the clock signals CLK2NM_A and CLK2NM_B (not shown in FIG. 6), in order to stably perform an internal circuit operation with the increase in frequency of the external clock signal CLK.

The clock signal CLK2NM_A may be obtained by dividing the external clock signal CLK at a preset division ratio, for example, a divided-by-two signal. The clock signal CLK2NM_B may be obtained by inverting the clock signal CLK2NM_A.

The clock signal CLK2NM_A and the clock signal CLK2NM_B are synchronized with an even clock signal and an odd clock signal of the external clock signal CLK, and may be referred to as an even clock signal and an odd clock signal.

The semiconductor integrated circuit according to the embodiments of the present invention may sense that a read command is successively inputted to any one of the up bank and the down bank and then inputted to the other bank.

Additionally, the read command may be inputted based on the even clock pulse or odd clock pulse of the external clock signal CLK.

Thus, in order to sense the read command inputted based on the clock signal CLK2NM_A and the read command inputted based on the clock signal CLK2NM_B, the first and second pre-delay control signal generators 210 and 220 are configured as illustrated in FIG. 2, and the outputs of the first and second pre-delay control signal generators 210 and 220 are combined to generate the delay control signal STROBE_DLYEN.

Hereafter, a case in which a predetermined number (for example, five) of read commands for selecting the up bank are successively inputted at an interval of 2CCD (CAS to CAS delay) based on an even clock pulse of the external clock signal CLK, that is, the clock signal CLK2NM_A and a read command for selecting the down bank is inputted will be taken as an example for description (refer to FIGS. 3, 5, and 6).

First, while the access period signal RDENO_A is deactivated, the shift control section 217 of the first pre-delay control signal generator 210 resets the first determination section 211. That is, the shift control section 217 sets outputs of the flip-flops of the shifter 212 to a logic high level.

At this time, the address signal BA<2> serves to define any one bank to be accessed between the up bank and the down bank of the memory block 101. As the address signal BA<2> has a logic low/logic high level, an area to be accessed in the memory block 101 may be defined as the up band/down bank.

Thus, while five read commands for selecting the up bank are successively inputted, that is, during 10tCK (i.e., 10 external clock cycles), the address BA<2> maintains a logic low level.

The first determination section 211 sequentially shifts the address signal BA<2> according to the shift clock signal RA and generates the plurality of shift signals NAAB, NBB, NCC, NDD, NEE, and NFF, after reset.

At this time, based on a rising edge of the last clock pulse of the shift clock signal RA after five read commands for selecting the up bank are successively inputted, all of the shifted signals NBB, NCC, NDD, NEE, and NFF have a logic high value.

Then, as a read command for selecting the down bank is inputted, the address signal BA<2> transits to a logic high level.

Since the plurality of shifted signals NBB, NCC, NDD, NEE, and NFF have a logic high value and the shifted signal NAAB has a logic high value, the first pre-delay control signal DLYEN_B2HB_A is activated to a logic low level.

The signal combiner 250 latches the first pre-delay control signal DLYEN_B2HB_A according to the access flag signal CASRDP6, and activates the delay control signal STROBE_DLYEN to a logic high level.

Furthermore, even when a read command for selecting the up bank is inputted after five read commands for selecting the down bank are successively inputted at an interval of 2CCD based on an even clock pulse of the external clock signal CLK, that is, the clock signal CLK2NM_A, the delay control signal STROBE_DLYEN is activated to a logic high level as described above.

That is, the second determination section 214 activates the first pre-delay control signal DLYEN_B2LB_A to a logic low level.

Then, the signal combiner 250 latches the first pre-delay control signal DLYEN_B2LB_A according to the access flag signal CASRDP6, and activates the delay control signal STROBE_DLYEN to a logic high level.

When a read command for selecting a down/up bank is inputted after a preset number of read commands for selecting an up/down bank, for example, five read commands are successively inputted at an interval of 2CCD based on an odd clock pulse of the external clock signal CLK, that is, the clock signal CLK2NM_B, the second pre-delay control signal DLYEN_B2HB_B/DLYEN_B2LB_B is activated by the operation of the second pre-delay control signal generator 230.

Then, the signal combiner 250 latches the second pre-delay control signal DLYEN_B2HB_B/DLYEN_B2LB_B according to the access flag signal CASRDP6, and activates the delay control signal STROBE_DLYEN to a logic high level.

Figure 7:
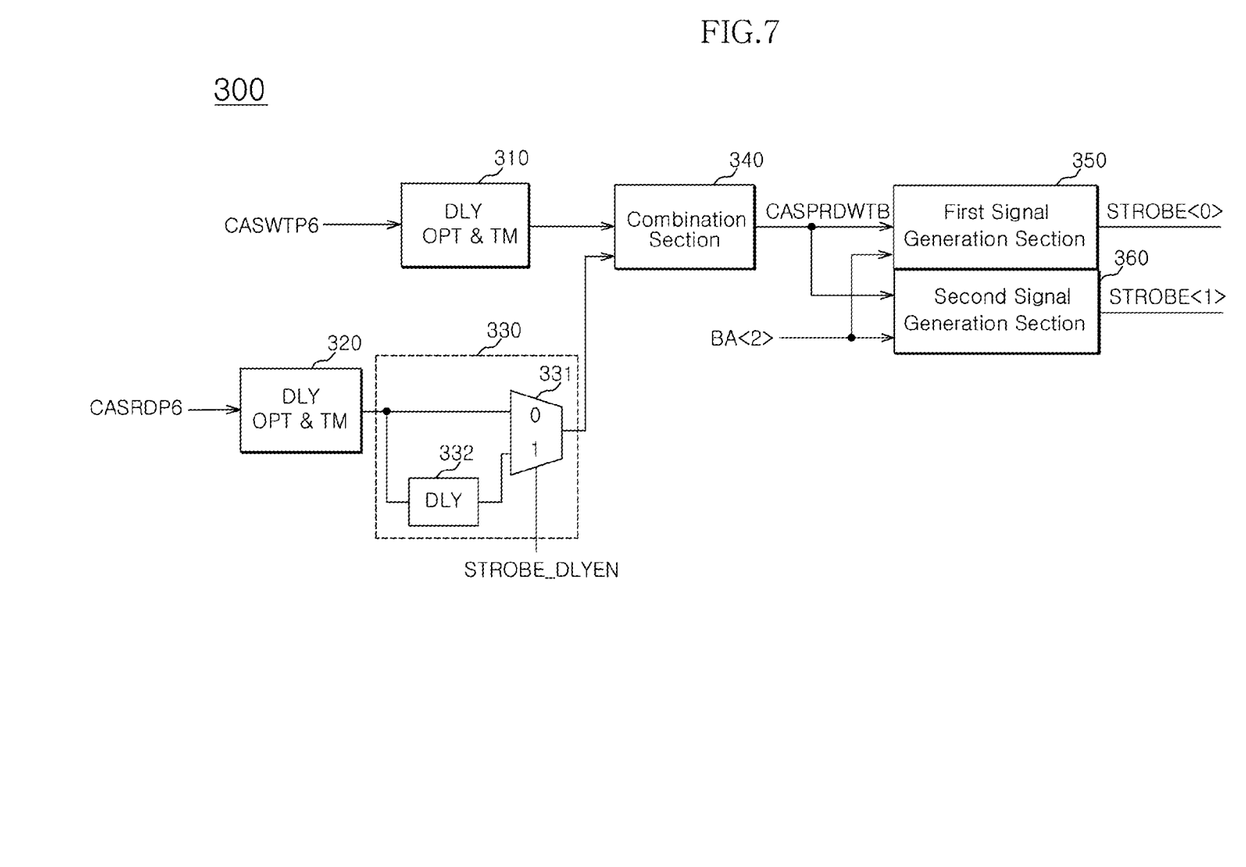
FIG. 7 is a block diagram illustrating the internal configuration of a source signal generation unit 300 of FIG. 1.

FIG. 7 is a block diagram illustrating the internal configuration of the source signal generation unit 300 of FIG. 1.

Referring to FIG. 7, the source signal generation unit 300 may include a first delay section 310 (i.e., DLY), a second delay section 320 (i.e., DLY), a delay control section 330, a combination section 340, a first signal generation section 350, and a second signal generation section 360.

The first delay section 310 may be configured to delay an access flag signal CASWTP6 by a preset time.

The access flag signal CASWTP6 may be generated according to a write command.

The second delay section 320 may be configured to delay the access flag signal CASRDP6 by a preset time.

Additionally, each of the first and second delay sections 310 and 320 may include an option circuit (i.e., OPT) and a test mode-related circuit (i.e., TM) for adjusting the delay time.

The delay control section 330 may include a multiplexer 331 (i.e., 0 1) and a delay 332 (i.e., DLY).

The delay control section 330 may be configured to select and output an output signal of the second delay section 320 or an output signal of the delay 332, obtained by increasing the delay time of the output signal of the second delay section 320, according to the delay control signal STROBE_DLYEN.

When the delay control signal STROBE_DLYEN is activated, the delay control section 330 selects and outputs the output signal of the delay 332.

The combination section 340 may be configured to combine the output signal of the first delay section 310 and the output signal of the delay control section 330 and generate an output signal CASRDWTB.

The first signal generation section 350 may be configured to generate the source signal STROBE<0> in response to the output signal CASRDWTB of the combination section 340 when the address signal BA<2> has a logic low level, that is, a level indicating the up bank.

The second signal generation section 360 may be configured to generate the source signal STROBE<1> in response to the output signal CASRDWTB of the combination section 340 when the address signal BA<2> has a logic high level, that is, a level indicating the down bank.

That is, when the delay control signal STROBE_DLYEN is activated, the source signal generation unit 300 delays and outputs the access flag signal CASRDP6 corresponding to the opposite bank (for example, the down bank) of a bank to which successive read commands are inputted (for example, the up bank). Thus, the source signal STROBE<1> supplied to the down bank is delayed by the preset time.

Figure 8:
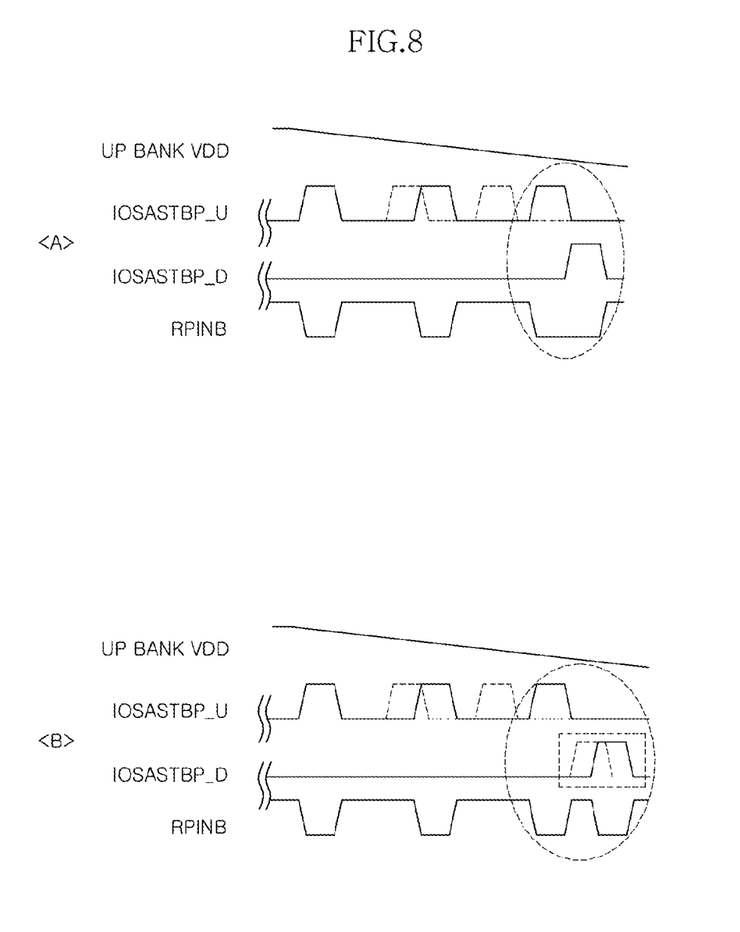
FIG. 8 is a waveform diagram for explaining an input control signal compensation operation according to the embodiments of the present invention.

FIG. 8 is a waveform diagram for explaining an input control signal compensation operation according to the embodiments of the present invention.

First, in a state where the embodiment of the present invention is not applied, suppose that a predetermined number of read commands for selecting the up bank (for example, five read commands) are successively inputted at an interval of 2CCD and a read command for selecting the down bank is then inputted.

In this case, as indicated by <A> of FIG. 8, the power supply voltage VDD of the up bank drops as a predetermined number of read commands for selecting the up bank (for example, five read commands) are successively inputted.

Thus, an input timing signal IOSASTBP_U generated by the up bank in response to the source signal STROBE<0> is moved back from normal timing (refer to a dotted line).

Since an input timing signal IOSASTBP_D generated by the down bank in response to the source signal STROBE<1> has normal timing, the two signals IOSASTBP_U and IOSASTBP_D abnormally overlap each other, thereby causing an error of the input timing signal RPINB.

Referring to FIG. 1, an error may also occur in the input control signals PIN<0:N> generated by the input control signal generation unit 103 in response to the plurality of input timing signals IOSASTBP_U, IOSASTBP_D, and RPINB in which errors occurred.

The error of the input control signals PIN<0:N> may cause a read operation error of the latch unit 104, that is, a data input operation error.

Furthermore, in a state where the embodiments of the present invention are applied, suppose that a predetermined number of read commands for selecting the up bank (for example, five read commands) are successively inputted at an interval of 2CCD and a read command for selecting the down bank is inputted.

In this case, as indicated by <B> of FIG. 8, the power supply voltage VDD of the up bank drops as a predetermined number of read commands for selecting the up bank (for example, five read commands) are successively inputted.

Thus, the input timing signal IOSASTBP_U generated by the up bank in response to the source signal STROBE<0> is moved back from a normal timing (refer to a dotted line).

However, the semiconductor integrated circuit according to the embodiments of the present invention senses that the read command for selecting the down bank is inputted after a predetermined number of read commands for selecting the up bank (for example, five read commands) are successively inputted at an interval of 2CCD and a read command for selecting the down bank is inputted, and thus delays the source signal STROBE<1> by a preset time.

Thus, since the input timing signal IOSASTBP_D generated by the down bank in response to the source STROBE<1> delayed by the preset time is delayed by the preset time from normal timing, the two signals IOSASTBP_U and IOSASTBP_D are prevented from overlapping each other.

Since the two signals IOSASTBP_U and IOSASTBP_D do not overlap each other, the input timing signal RPINB is normally generated.

Referring to FIG. 1, the input control signal generation unit 103 may normally generate the input control signal PIN<0:N> in response to the normal input timing signals IOSASTBP_U, IOSASTBP_D, and RPINB.

As a result, since the input control signal PIN<0:N> is normally generated, the data input operation of the latch unit 104 may be normally performed.

According to the embodiments of the present invention, it is possible to increase the stability of the data latch operation.

While various embodiments have been described above, it will be understood to those skilled in the art that the embodiments described are by way of example only. Accordingly, the semiconductor integrated circuit described herein should not be limited based on the described embodiments.

What is claimed is:

1. A semiconductor integrated circuit comprising:
   a latch unit configured to latch data in response to an input control signal; and
   a latch control unit configured to determine whether or not any one of a one memory area and another memory area is successively accessed, and adjust timing of the input control signal,
   wherein the latch control unit adjusts the timing of the input control signal when the other memory area is accessed in a state where the number of successive accesses to the one memory area is equal to or more than a preset number.

2. The semiconductor integrated circuit according to claim 1, wherein the latch unit comprises a pipe latch.

3. The semiconductor integrated circuit according to claim 1, wherein the latch control unit adjusts timing of a source signal for generating the input control signal, thereby adjusting the timing of the input control signal.

4. The semiconductor integrated circuit according to claim 3, further comprising:
   a memory block configured to generate a plurality of input timing signals in response to the source signal; and
   an input control signal generation unit configured to generate the input control signal in response to the plurality of input timing signals.

5. The semiconductor integrated circuit according to claim 3, wherein the latch control unit comprises;
   a delay control signal generation unit configured to determine whether the number of successive accesses to the one memory area is equal to or more than a preset number in response to a clock signal, an access period signal, an address signal, and an access flag signal, and generate a delay control signal according to the determination result; and
   a source signal generation unit configured to generate the source signal in response to the delay control signal, the address signal, and the access flag signal.

6. The semiconductor integrated circuit according to claim 5, wherein the clock signal comprises a divided clock signal obtained by dividing an external clock signal at a preset division ratio.

7. The semiconductor integrated circuit according to claim 5, wherein the access comprises a read command.

8. The semiconductor integrated circuit according to claim 5, wherein the one memory area is selected according to the address signal.

9. The semiconductor integrated circuit according to claim 5, wherein the source signal generation unit is configured to increase a delay time of the access flag signal in response to the delay control signal.

10. The semiconductor integrated circuit according to claim 5, wherein the delay control signal generation unit comprises:
    a determination section configured to determine whether the other memory area or the one memory area is accessed in a state where successive accesses to the one memory area or the other memory area were performed a predetermined number of times or more in response to the address signal, and activate the delay control signal; and
    a shift control section configured to control the determination section in response to the clock signal and the access period signal.

11. The semiconductor integrated circuit according to claim 10, wherein the determination section comprises:
    a shifter configured to sequentially shift the address signal according to a shift clock signal and generates a plurality of shifted signals; and
    a successive access determination logic configured to combine the plurality of shifted signals and generate the delay control signal.

12. The semiconductor integrated circuit according to claim 11, wherein the shift control section is configured to perform a first logic operation on the clock signal and the access period signal and output the operation result as the shift clock signal.

13. The semiconductor integrated circuit according to claim 12, wherein the shift control section is configured to perform a second logic operation on the clock signal and the access period signal and reset the determination section.

14. The semiconductor integrated circuit according to claim 5, wherein the source signal generation unit comprises:
    a delay configured to delay the access flag signal by a preset time;
    a multiplexer configured to select and output an output signal of the delay or the access flag signal in response to the delay control signal; and
    a signal generation section configured to output an output signal of the multiplexer as the source signal in response to the address signal.

15. The semiconductor integrated circuit according to claim 5, wherein the access flag signal is generated in response to a read command.

16. The semiconductor integrated circuit according to claim 1, wherein the latch control unit is configured to adjust timing of a source signal for generating the input control signal, corresponding to the other memory area, when the other memory area is accessed in a state where the number of successive accesses to the one memory area is equal to or more than a preset number.

17. The semiconductor integrated circuit according to claim 16, wherein the latch control unit is configured to increase a delay time of the source signal corresponding to the other memory area when the other memory area is accessed in a state where the number of successive accesses to the one memory area is equal to or more than the preset number.

18. A semiconductor integrated circuit comprising:
    a memory block configured to output data in response to an access to the memory block and generate a timing signal in response to a source signal;
    a latch unit configured to latch the data in response to an input control signal;
    a delay control signal generation unit configured to determine whether the number of successive accesses to any one of a one memory area and an other memory area of the memory block is equal to or more than a preset number according to an address signal and an access flag signal based on an even clock signal and an odd clock signal, respectively, and generate a delay control signal;
    a source signal generation unit configured to generate the source signal by adjusting timing of the access flag signal in response to the delay control signal; and
    an input control signal generation unit configured to generate the input control signal in response to the timing signal.

19. The semiconductor integrated circuit according to claim 18, wherein the latch unit comprises a pipe latch.

20. The semiconductor integrated circuit according to claim 18, wherein the access flag signal is generated in response to a read command.

21. The semiconductor integrated circuit according to claim 18, wherein the delay control signal generation unit comprises:
    a first pre-delay control signal generator configured to generate a first pre-delay control signal pair in response to an access period signal, the even clock signal, and the address signal;
    a second pre-delay control signal generator configured to generate a second pre-delay control signal pair in response to the access period signal, the odd clock signal, and the address signal; and
    a signal combiner configured to generate the delay control signal in response to the first pre-delay control signal pair, the second pre-delay control signal pair, and the access flag signal.

22. The semiconductor integrated circuit according to claim 21, wherein the first pre-delay control signal generator comprises:
    a first determination section configured to determine whether or not the other memory area is accessed in a state where successive accesses to the one memory area were performed a predetermined number of times or more in response to the address signal, and activate any one signal of the first pre-delay control signal pair;
    a second determination section configured to determine whether or not the one memory area is accessed in a state where successive accesses to the other memory area were performed a preset number of times or more in response to the address signal, and activate the other signal of the first pre-delay control signal pair; and
    a shift control section configured to control the first and second determination sections in response to the even clock signal and the access period signal.

23. The semiconductor integrated circuit according to claim 22, wherein the first determination section comprises:
    a shifter configured to sequentially shift the address signal according to a shift clock signal and generate a plurality of shifted signals; and
    a successive access determination logic configured to combine the plurality of shifted signals and activate any one signal of the first pre-delay control signal pair.

24. The semiconductor integrated circuit according to claim 23, wherein the shift control section is configured to perform a first logic operation on the even clock signal and the access period signal and output the operation result as the shift clock signal.

25. The semiconductor integrated circuit according to claim 24, wherein the shift control section is configured to perform a second logic operation on the even clock signal and the access period signal and reset the first and second determination sections.

26. The semiconductor integrated circuit according to claim 18, wherein the source signal generation unit comprises:
    a delay configured to delay the access flag signal by a preset time;
    a multiplexer configured to select and output an output signal of the delay or the access flag signal in response to the delay control signal; and
    a signal generation section configured to output the output signal of the multiplexer as the source signal in response to the address signal.

* * * * *